(12) United States Patent
Bloom

(10) Patent No.: US 6,293,404 B1
(45) Date of Patent: Sep. 25, 2001

(54) NON-NESTING COMPONENT CARRIER TAPE

(75) Inventor: Raymond J. Bloom, Minnetonka, MN (US)

(73) Assignee: Advantek, Inc., Minnetonka, MN (US)

( * ) Notice: Subject to any disclaimer, the term of this patent is extended or adjusted under 35 U.S.C. 154(b) by 0 days.

(21) Appl. No.: 09/511,279

(22) Filed: Feb. 23, 2000

(51) Int. Cl.⁷ .................................................. B65D 89/00
(52) U.S. Cl. .......................................... 206/714; 206/725
(58) Field of Search .................................. 206/820, 714, 206/717, 718, 725, 726, 804, 815, 390, 526

(56) References Cited

U.S. PATENT DOCUMENTS

| | | |
|---|---|---|
| 4,702,370 | 10/1987 | Honda . |
| 4,726,534 | 2/1988 | Chenoweth . |
| 4,898,275 | 2/1990 | Skrtic et al. . |
| 5,152,393 | 10/1992 | Chenoweth . |
| 5,361,901 | * 11/1994 | Schenz et al. ................ 206/714 |
| 5,746,319 | * 5/1998 | Murphy ........................ 206/725 |

* cited by examiner

*Primary Examiner*—Shian Luong

(57) ABSTRACT

A microchip carrier tape has a plurality of sets of pockets for accommodating microchips. Each set of pockets has side walls and end walls joined to bottom walls. The side walls in selected pockets have recesses at the juncture of the side walls with end walls. The bottom walls of the pockets have extensions that inhibit nesting or copulation of portions of the tape that are superimposed when wound on a reel.

18 Claims, 2 Drawing Sheets

NON-NESTING COMPONENT CARRIER TAPE

TECHNICAL FIELD

The invention relates to elongated flexible tapes having longitudinal spaced pockets for holding electronic components, such as microchips. The tapes are wound on reels used to transport the tapes to facilities to load electric components into the pockets. The tapes carrying the electronic components are shipped to manufacturing locations where the electric components are removed from the tapes and assembled into electronic devices.

BACKGROUND OF THE INVENTION

Plastic tapes for storing electronic components, such as microchips, have a series of identical pockets which hold electronic components. An example of a microchip carrier tape with a cover tape to retain microchips in the pockets in the tape is disclosed by D. B. Chenoweth in U.S. Pat. No. 5,152,393. The tape is an elongated strip of flexible plastic having pockets made with the use of male and female die sets. The tape has thickness of about 0.025 centimeter whereby the tape can readily be bent, twisted and crushed. The tape, having pockets, moves from the die sets in an elongated continuous ribbon toward a reel. The reel rotates to take up the tape and store the tape in superimposed wraps or spiral turns. An example of a reel assembly for accommodating microchip carrier tape is disclosed by D. B. Chenoweth in U.S. Pat. No. 4,726,534. The die sets are operated to deform a heated thermoplastic strip to produce generally rectangular pockets along the length of the strip. The tape has end walls, side walls, and a bottom wall defining each pocket. The end and side walls have a draft or taper to allow the dies sets to separate or release from the tape. The area of the bottom wall is smaller than the are of the top opening of the pocket. The draft in the side and end walls and size of the bottom wall of the tape allows the superimposed or adjacent sections of the tape to nest or interengage when wound on a reel. The outer surfaces of the end and side walls of the nested portions of the tape have a relatively tight fit with the inner surfaces of the end and side walls of the adjacent portions of the tape. The nested portions of the tape can be locked together. A substantial pulling force is required to separate the nested portions of the tape. This force causes uneven unwinding of the tape from the reel and can deform the tape so that it cannot be used with automatic microchip loading and unloading machines. A component carrier tape having anti-nesting shoulders on the pocket side walls of the tape is disclosed by T. Skrtic and T. J. Juntunen in U.S. Pat. No. 4,898,275. The recesses are located in the walls of each pocket. The transverse strength of the tape is compromised with recesses in the middle sections of the tapes'side walls. Identical sized recesses and locations of the recesses in the diagonal corners of all of the pockets of the tape does not prohibit nesting of superimposed portions of the tape. The recesses in the diagonal corner of the tape also allows diagonal flexing of the tape. The vertical wall forming the recesses open to the pockets reduces the wall thickness. There are high stress points which can result in rupture of the side walls of the tape.

SUMMARY OF THE INVENTION

The microchip carrier tape of the invention has sets of identical pockets for accommodating microchips. Each set of pockets has recesses in selected corners of the pockets provided by outwardly directed side wall portions located adjacent end walls of the pockets. The bottoms of the recesses are closed with extensions of the bottom walls of the pockets whereby the extensions are projections which inhibit nesting or copulation of portions of the tape that are on top of each other. The transverse and twisting strength is not materially compromised as there are no recesses in the middle portion of the side walls of the tape and the thickness of the side walls of the tape is not reduced in the areas of the recesses.

The microchip carrier tape is an elongated flexible plastic strip having a plurality of sets or series of a plurality of pockets for holding microchips. Each set of pockets has five pockets. The number of pockets in each set of pockets can very and include more than five (5) pockets. The strip has longitudinal tapered end walls and transverse tapered side walls joined to a bottom wall defining each pocket. The bottom wall is generally flat. Ribs and projections raised from the bottom wall are used in some tapes to support microchips in the pockets. Recesses open to the pockets are located in only one side wall of each pocket at the junction of the one side wall and the end wall adjacent the one side wall. The bottom walls have extensions that close the bottoms of the recesses. The extensions are projections or stops that inhibit nesting of the end walls and side walls into superimposed sets of pockets when the. tape is wound on a reel. The side walls of the pocket have side walls portions extended about the recesses. The side wall portions are located in longitudinal directions away from the pockets and have a taper or draft and thickness that is substantially the same as the draft and thickness as the main side walls of the pockets. The side wall portions have generally semi-cylindrical or V-shaped continuous shapes which sustain the crushing strength of the tape.

In the preferred embodiment of the tape, the plastic strip has side flanges and transverse bridges joined to the side flanges. The bridges are located between adjacent the pockets of each set of pockets and between each set of pockets. The bridges allow the tape to transversely flex or bend without substantially altering the shape, size and function of the pockets. The strip for each set of pockets has five (5) pairs or longitudinal end walls and five (5) pairs of transverse side walls joined to a bottom wall. Each of the pockets has a generally rectangular shape with four (4) corners at the junctures of adjacent end walls and side walls. The first pocket clockwise from the top right corner of the tape has a first recess in the first corner of the pocket. The second pocket does not have any recesses. The third pocket has a second recess in the third corner thereof. The fourth pocket has a third recess in the fourth corner thereof. The fifth pocket has a fourth recess in the second corner thereof. The bottom walls have extensions that close the bottoms of the recesses whereby the extensions are projections and stops that inhibit nesting of all of the end walls and side walls into superimposed portions of the tape.

DESCRIPTION OF PREFERRED EMBODIMENTS OF THE INVENTION

Figure 1:
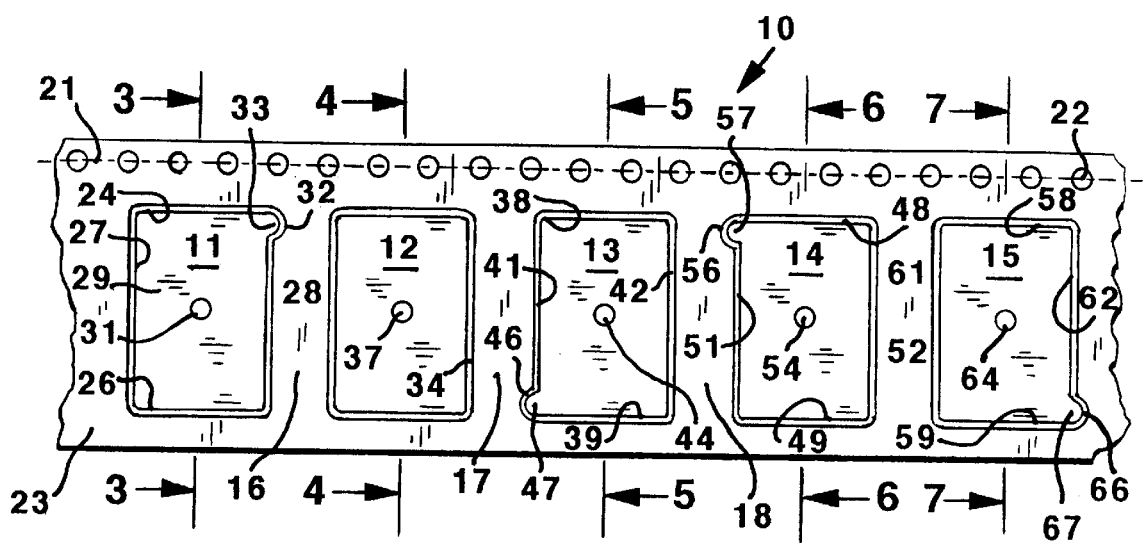
FIG. 1 is a top plan view of a portion of a component carrier tape of the invention.
Figure 2:
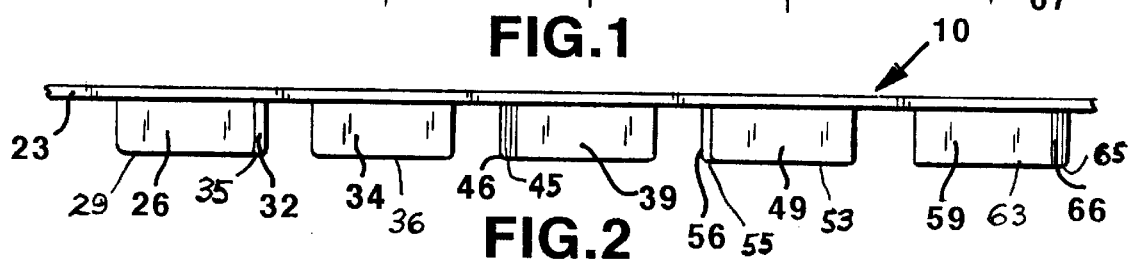
FIG. 2 is a side elevational view thereof.

Tape 10, shown in FIG. 1, has a plurality of sets of pockets for accommodating microchips and electronic components. The tape is a thin, laginated thermoplastic having the sets of pockets made with male and female die sets. The sets of pockets are a group of pockets located in series along the length of the tape. Referring to FIGS. 1 and 2, there is shown a portion of an elongated tape 10 having longitudinally spaced pockets 11, 12, 13, 14 and 15 for accommodating electronic components, such as microchips. Pockets 11–15 have generally rectangular shapes.

Other pocket configurations, such as square, round and diamond, can be stamped in Tape 10. Tape 10 has substantial length with sets of pockets spaced along the entire length of the tape. In use, the tape 10 is wound on a reel and shipped to microchip manufacturers and suppliers. An example of a reel assembly for accommodating component carrier tape is disclosed by D. B. Chenoweth in U.S. Pat. No. 4,726,534. Component carrier tapes having pockets have a tendency for the pocket structures to nest or settle into each other as a tape is wound on the reel. Tape 10 has a series of stop structures which inhibit nesting of adjacent turns of the tape on the reel. The non-nesting of the tape on the reel facilitates smooth winding of the tape from the reel. Adjacent pockets 11–15 are separated from each other with transverse bridges 16, 17, 18 which are joined to longitudinal side flanges 21 and 23. Flange 23 has a row of longitudinally spaced holes 22 which accommodate a drive sprocket for moving the tape through component loading and unloading machines. The bridges 16–18 located is a common top plane of the tape 10 which allows the tape to transversely flex and bend as the tape is wound on the reel.

Figure 3:
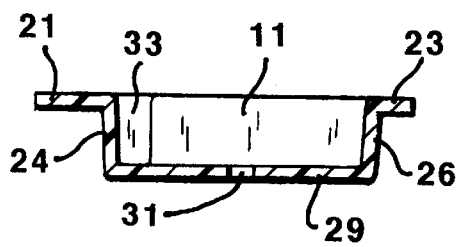
FIG. 3 is an enlarged sectional view taken along line 3—3 of FIG. 1.
Figure 4:
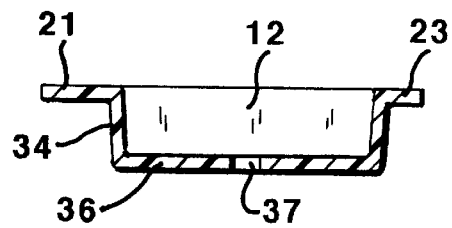
FIG. 4 is an enlarged sectional view taken along line 4—4 of FIG. 1.
Figure 5:
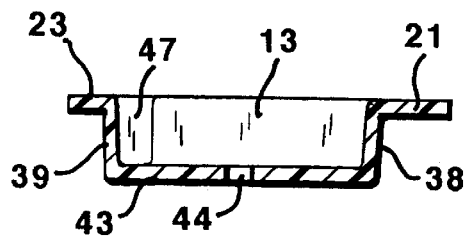
FIG. 5 is an enlarged sectional view taken along line 5—5 of FIG. 1.

As shown in FIGS. 1 and 3, tape 10 has downwardly extended longitudinal end walls 24 and 26 joined to transverse side walls 27 and 28 surrounding pocket 11. Walls 24 and 26–28 are joined to a generally flat bottom wall 29. A centrally-located hole 31 in bottom wall 29 allows for optical reading with a light beam to ascertain the presence of a microchip in pocket 11. The upper right hand corner of pocket 11 is open to an upright recess 33. The upper end of side wall 28, viewed in FIG. 1, has a semi-cylindrical wall portion 33 extended down to bottom wall 29. Pocket 12 is longitudinally separated from pocket 11 with bridge 16 has a rectangular-shaped side and end wall 34 joined to a flat bottom wall 36. The center of bottom wall 36 has a component inspection hole 37. Wall 34 has tapered continuous linear sides and ends. Tape 10 has longitudinal end walls 38 and 39 joined to transverse side walls 41 and 42 surrounding pocket 13. As shown in FIG. 5, walls 38, 39 and 41, 42 are joined to a flat bottom wall 43 having a central component inspection hole 44. The lower left-hand corner of side wall 41, view in FIG. 1, has a downwardly extended recess 47 open to the lower left-hand corner of pocket 13. A semi-cylindrical side wall portion 46 extended to bottom wall extension 45 outlines recess 47. The bottom wall extension 45 is a projection or stop that inhibits nesting of the tape when wound on a reel.

Figure 6:
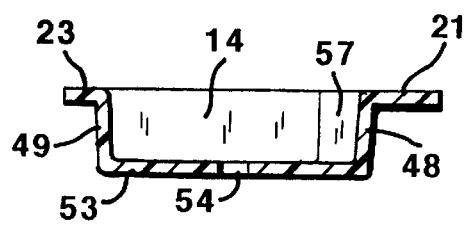
FIG. 6 is an enlarged sectional view taken along line 6—6 of FIG. 1.

Returning to FIG. 1, tape 10 has a longitudinal end walls 48 and 49 joined to transverse side walls 51 and 52. Walls 48, 49 and 51, 52 surround rectangular pocket 14. As shown in FIG. 6, the bottom of pocket 14 is closed with a bottom wall 53 having a center component inspection hole 54. The upper end of side wall 51 has a semi-cylindrical side wall portion 56 extended downwardly to the bottom wall 53. Side wall portion surrounds a recess 57 open to the upper left-hand corner of pocket 14. The bottom of side wall portion 56 is an extension 55 of bottom wall 53 and a stop which prevents pocket end walls 48 and 49 and side walls 51 and 52 from nesting into all pockets except an adjacent pocket having the shape of pocket 14 and position of recess 57.

Figure 7:
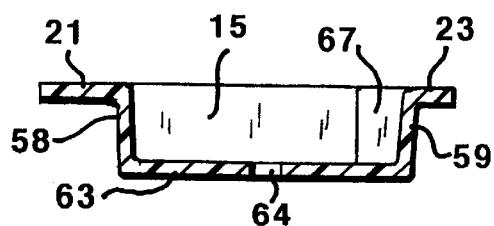
FIG. 7 is an enlarged sectional view taken along line 7—7 of FIG. 1.
Figure 8:
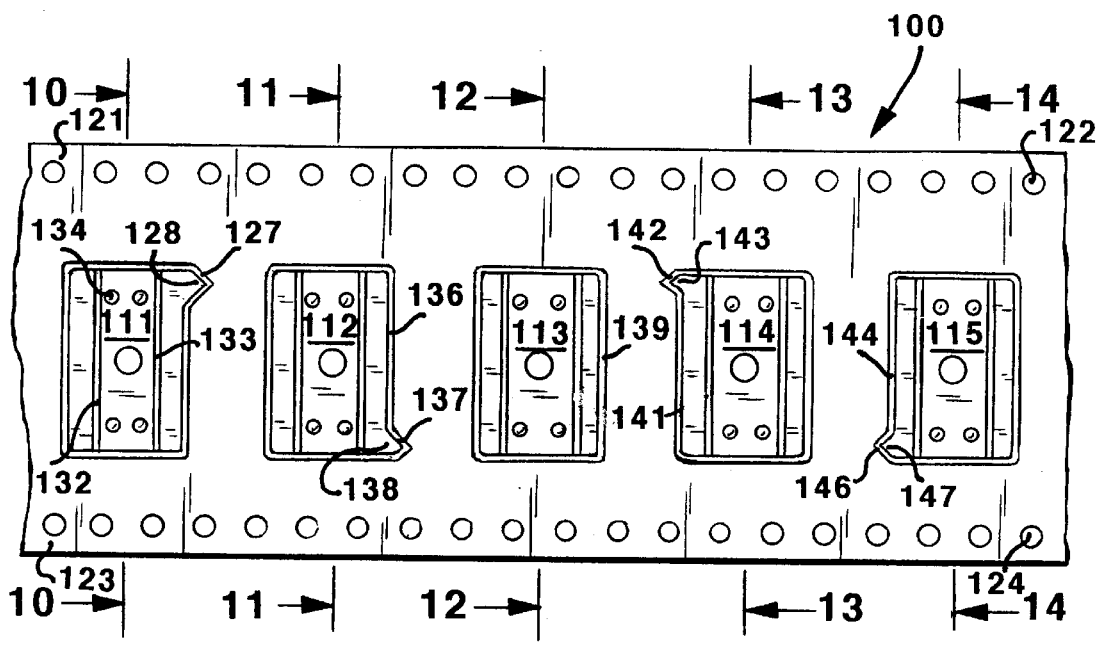
FIG. 8 is a-top plan view of a modification of a portion of a component carrier tape of the invention.
Figure 9:
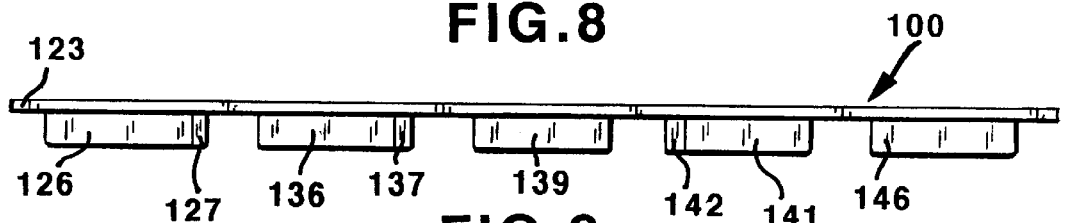
FIG. 9 is a side elevational view of FIG. 8.
Figure 10:
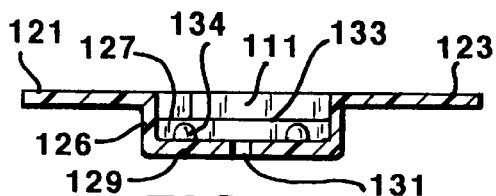
FIG. 10 is an enlarged sectional view taken along line 10—10-of FIG. 8.
Figure 11:
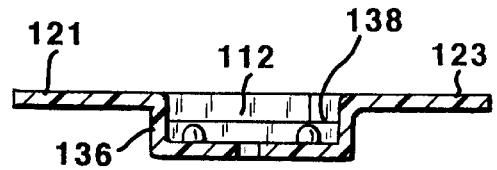
FIG. 11 is an enlarged sectional view taken along line 11—11-of FIG. 8.
Figure 12:
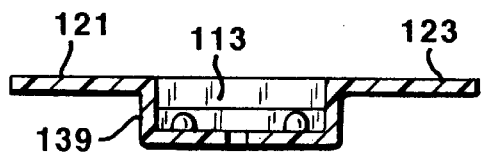
FIG. 12 is an enlarged sectional view taken along line 12—12-of FIG. 8.
Figure 13:
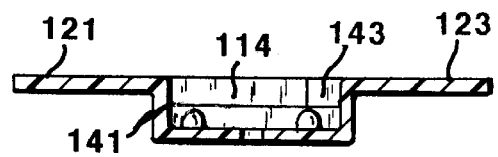
FIG. 13 is an enlarged sectional view taken along line 13—13-of FIG. 8.
Figure 14:
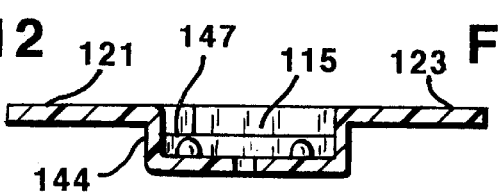
FIG. 14 is an enlarged sectional view taken along line 14—14 of FIG. 8.

The fifth pocket 15 of tape 10 is in communication with a recess 67 located in the lower right-hand corner of pocket 15. As shown in FIGS. 1 and 7, tape has longitudinal end walls 58 and 59 joined to transverse side walls 61 and 62. A bottom wall 63 jointed to walls 58, 59, 61 and 62 closes the bottom of pocket 15. A hole 4 in the center of bottom wall 63 is used as a component inspection port. The lower end of side wall 62 has a semi-cylindrical side wall portion 66 extended to the bottom wall 63. The bottom of side wall portion 66 is joined to an extension 65 of bottom wall 63 which provides a stop that inhibits pocket end wall 58 and 59 and side walls 61 and 62 from nesting into all pockets when wound on a reel except a pocket that is identical to pocket 15 and a recess located in the position of recess 67.

The series of pockets 11–15 has the same tapers, shapes and sizes except for the locations of recesses 33, 47, 57 and 67 and pocket 12 which is not associated with a recess. The recesses 33, 47, 57 and 67 are located in upper and lower ends of side walls 28, 41, 51 and 51. The bottom ends of side wall portions 32, 46, 56 and 66 being coextensive with the bottom walls 29, 43, 53 and 63 are stops or obstructions which prevent nesting of the tape as it is wound on a reel assembly.

A modification of a microchip carrier tape 100 of the invention, shown in FIGS. 8 to 14 has a set of five (5)

pockets 111–115 with recesses 127, 138, 143 and 147 open to the four corners of the pockets. Pocket 113 has downwardly tapered walls 139 which do not have a recess. The tape 100 has downwardly tapered side walls 126, 136, 141 and 144 and end walls joined to opposite ends of the side walls surrounding each generally rectangular pocket. A first V-shaped side wall portion 127 of tape 100 is a tapered side wall for recess 128. A second V-shaped side wall portion 137 comprises the tapered side wall for recess 138. Downwardly extend side wall portions 142 and 146 are the side walls for recesses 143 and 147. The downward taper or draft of the side walls including side wall portion 127, 137, 142 and 146 is uniform. The wall thickness of side wall portions 127, 137, 142 and 146 is not reduced whereby the strength of the tape around the pockets is not compromised.

As shown in FIGS. 8, and 10 to 14, bottom walls of each of the pockets 111–115 have a pair of transverse ribs and upright projections located between the ribs for supporting microchips or flat pockets in the pockets. Pocket bottom wall 129 of pocket 111 has a pair of continuous upright and transverse ribs 132 and 133 extended between the end walls at opposite ends of the pocket 111. Two pair of cylindrical buttons or projections 134 extend upwardly from bottom wall 129 between opposite ends of ribs 132 and 133. The bottom surface of a microchip is supported on projections to locate the microchip above the bottom wall. The ribs 132 and 133 located adjacent opposite sides of the microchip restrict longitudinal movement of the microchips in the pocket. The bottom walls of pockets 112–115 have the same rib and projection structures as shown in pocket 111 described above. The bottom walls, including bottom wall 129, have extensions that extend to side wall portions 127, 137, 142 and 146 providing bottom walls for recesses 128, 138, 143 and 147. The extensions are projections and stops that inhibit nesting of superimposed portions of tape 100 when wound on a reel.

While there have been shown and described preferred embodiments of the tape of the invention, it is understood that changes in structure arrangement of structure, and materials may be made by those skilled in the art without departing from the invention. The invention is defined in the following claims.

What is claimed is:

1. A tape for accommodating microchips comprising: a longitudinal strip having a plurality of sets of a plurality of more than three pockets in each set for holding a microchip in each pocket, each set of said pockets being provided by said strip having longitudinal end walls, transverse side walls and bottom walls joined to the end walls and side walls surrounding each pocket and recess means in said walls at corner junctions between adjacent end walls and side walls except one of the pockets, said recess means comprising only one recess open to each pocket, said recess located in only one side wall of each pocket at the corner junction of the one side wall and adjacent end wall, said recess extended outwardly from the pocket in different corner junctions of the more than three pockets in each set of pockets, said bottom walls having extensions located at the bottoms of all of said recesses, said extensions being operable to inhibit nesting of the end walls and side walls into superimposed sets of pockets when the tape is wound on a reel.

2. The tape of claim 1 wherein: the one side wall has a side wall portion joined to the adjacent end wall, said side wall portion extended around the recess in said one side wall, and the extension of the bottom wall being joined to said side wall portion.

3. The tape of claim 2 wherein: said side wall portion has a generally semi-cylindrical shape.

4. The tape of claim 2 wherein: said side wall portion has a generally V-shape.

5. The tape of claim 1 wherein: each of said bottom walls is generally flat.

6. The tape of claim 1 wherein: each bottom wall includes upwardly extended and longitudinally spaced transverse ribs, said ribs being spaced from the side walls and joined to the end walls, and upright projections between said ribs for supporting a microchip in a pocket.

7. The tape of claim 1 wherein: each set of pockets has five pockets.

8. A tape for accommodating microchips comprising: a longitudinal plastic strip having a plurality of sets of five generally rectangular pockets for holding a microchip in each pocket, said strip having side flanges and transverse bridges joined to the side flanges, said bridges being located between adjacent pockets, each set of said pockets being provided by said strip having first, second, third, fourth and fifth pairs of longitudinal end walls and first, second, third, fourth and fifth pairs of transverse side walls surrounding said five pockets of each set of pockets, bottom walls joined to said end walls and side walls, each of said pockets having first, second, third and fourth corners at the junction of adjacent end walls and side walls, said first pocket having only one outwardly directed first recess in the first corner thereof open to the pocket, said second pocket having no recess in the end and side walls, said third pocket having only one outwardly directed second recess in the third corner thereof, said fourth pocket having only one outwardly directed third recess in the fourth corner thereof, said fifth pocket having only one outwardly directed fourth recess in the second corner thereof, said bottom walls having extensions located at the bottoms of all said recesses, said extensions being operable to inhibit nesting of all of the end walls and side walls into superimposed sets of pockets when the tape is wound on a reel.

9. The tape of claim 8 wherein: one side wall of each pair of said side walls that has the recess has a side wall portion joined to an adjacent end wall, said side wall portion extended around one of the recesses, and said extension of the bottom wall being joined to said side wall portion.

10. The tape of claim 9 wherein: said side wall portion has a generally semi-cylindrical shape.

11. The tape of claim 9 wherein: said side wall portion has a generally V-shape.

12. The tape of claim 8 wherein: each of said bottom walls is generally flat.

13. The tape of claim 8 wherein: each of said includes upwardly extended and longitudinally spaced transverse ribs, said ribs being spaced from the side walls and joined to the end walls, and upright projections between said ribs for supporting a microchip in a pocket.

14. A tape for accommodating microchips comprising: a longitudinal plastic strip having a plurality of sets of five generally rectangular pockets for holding a microchip in each pocket, each set of said pockets being provided by said strip having first, second, third, fourth and fifth pairs of transverse parallel side walls and first, second, third, fourth, and fifth parallel end walls surrounding said five pockets of each set of pockets, bottom walls joined to said end walls and side walls, each of said bottom walls having upwardly extended parallel transverse linear ribs extended between and joined to said end walls, said ribs being spaced apart and spaced from the side walls for restricting longitudinal movement of a microchip in the pocket, and upright projections between said ribs for supporting a microchip in the pocket, each of said pockets having first, second, third and fourth corners at the junctions of adjacent end walls and side walls, said first pocket having only one outwardly directed first recess in the first corner thereof open to the pocket, said second pocket having no recess in the side and end walls and corners thereof, said third pocket having only one second recess in the third corner thereof, said fourth pocket having only one outwardly directed third recess in the fourth corner thereof, said fifth pocket having only one outwardly directed fourth recess in the second corner thereof, said bottom walls having extensions located at the bottoms of all said recesses, said extensions being operable to inhibit nesting of all of the end walls and side walls into superimposed sets of pockets when the tape is wound on a reel.

15. The tape of claim 14 wherein: one side wall that has the recess of each pair of side walls has a side wall portion joined to an adjacent end wall, said side wall portion extended around one of the recesses, and said extension of the bottom wall being joined to said side wall portion.

16. The tape of claim 15 wherein: said side wall portion has a generally semi-cylindrical shape.

17. The tape of claim 15 wherein: said side wall portion has a generally V-shape.

18. The tape of claim 14 wherein: each of said bottom walls is generally flat.

* * * * *